(12) United States Patent
Tripathi et al.

(10) Patent No.: US 9,401,715 B1
(45) Date of Patent: Jul. 26, 2016

(54) CONDITIONAL PULSE GENERATOR CIRCUIT FOR LOW POWER PULSE TRIGGERED FLIP FLOP

(71) Applicant: STMicroelectronics International N.V., Amsterdam (NL)

(72) Inventors: Alok Kumar Tripathi, Ghaziabad (IN); Priyankar Mathuria, Varanasi (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 14/718,204

(22) Filed: May 21, 2015

(51) Int. Cl.
*H03K 3/356* (2006.01)
*H03K 19/00* (2006.01)

(52) U.S. Cl.
CPC ...... *H03K 19/0013* (2013.01); *H03K 3/356165* (2013.01)

(58) Field of Classification Search
None
See application file for complete search history.

(56) References Cited

U.S. PATENT DOCUMENTS

| 7,253,661 B1 * | 8/2007 | Tuan | H03K 3/356052 327/219 |
| 7,456,669 B2 * | 11/2008 | Teh | H03K 3/012 327/199 |
| 2008/0116953 A1 * | 5/2008 | Hirata | H03K 3/35625 327/218 |

* cited by examiner

*Primary Examiner* — Long Nguyen
(74) *Attorney, Agent, or Firm* — Gardere Wynne Sewell LLP

(57) ABSTRACT

An electronic device includes a pulsed latch circuit configured to latch a data input signal to an output based upon receipt of a pulse signal. A pulse generation circuit is configured to compare the data input signal and an output signal at the output of the pulsed latch circuit, and to generate the pulse signal based upon a mismatch therebetween in response to a clock signal.

22 Claims, 4 Drawing Sheets

CONDITIONAL PULSE GENERATOR CIRCUIT FOR LOW POWER PULSE TRIGGERED FLIP FLOP

TECHNICAL FIELD

This disclosure relates to the field of electronic devices, and more particularly, to a low power consumption flip flop.

BACKGROUND

Reducing power consumption in electronic devices is greatly desirable in numerous applications, such as battery powered applications. A substantial consumption of power in an electronic device results from the switching of transistors. Therefore, ways of reducing the volume of switching done by transistors in electronic devices, while still accomplishing the desired design goals, is desirable.

As an example, flip flops are used in a variety of circuits, such as registers. Conventional flip flops are formed from two latches triggered by a clock signal. However, when the input and output of certain flip flops has not changed from a preceding clock cycle, the triggering of the flip flop does not change the state of the output, yet does result in switching of transistors and therefore excess power consumption.

Therefore, further developments in ways to trigger flip flops so as to reduce switching are desirable.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

An electronic device includes a flip flop circuit configured to latch a data input signal to an output based upon receipt of a pulse signal. A pulse generation circuit is configured to compare the current data input signal at the active edge of the clock and a previous output signal at the output of the flip flop circuit, and to generate the pulse signal based upon a mismatch between the output state and input state in response to a clock signal.

The pulse generation circuit includes a comparison circuit configured to receive the data input signal and the output signal and to generate a comparison signal based thereupon, with the comparison signal having a first logic level when the data input signal and the output signal are mismatched and having a second logic level when the data input signal and the output signal match. A comparison output circuit is configured to generate a comparison output based upon the comparison signal in response to the clock signal, with the comparison output having the first logic level when the comparison signal has the first logic level and having the second logic level when the comparison signal has the second logic level.

The comparison circuit includes a first logic circuit having inputs coupled to the output signal and a complement of the data input signal, a second logic circuit having inputs coupled to a complement of the output signal and the data input signal, and a comparison node coupled to outputs of the first and second logic circuits.

The first logic circuit includes a first PMOS transistor having a source terminal coupled to a supply voltage, a drain terminal, and a gate terminal coupled to the output signal. A second PMOS transistor has a source terminal coupled to the drain terminal of the first PMOS transistor, a drain terminal coupled to the comparison node, and a gate terminal coupled to the coupled to the complement of the data input signal.

The second logic circuit includes a third PMOS transistor having a source terminal coupled to the supply voltage, a drain terminal, and a gate terminal coupled to the complement of the output signal, and a fourth PMOS transistor having a source terminal coupled to the drain terminal of the third PMOS transistor, a drain terminal coupled to the comparison node, and a gate terminal coupled to the data input signal.

The comparison output circuit comprises a fifth PMOS transistor having a source terminal coupled to receive the comparison signal, a drain terminal coupled to a node, and a gate terminal coupled to the clock signal.

The pulse generation circuit also includes a first switch circuit configured to receive the comparison output and the clock signal and to generate a first switch output based thereupon, the first switch output having the second logic level based upon the comparison output having the first logic level.

The first switch circuit includes a first NMOS transistor having a drain terminal coupled to a first switch output, a source terminal, and a gate terminal coupled to the clock signal, and a second NMOS transistor having a drain terminal coupled to the source terminal of the first NMOS transistor, a source terminal coupled to ground, and a gate terminal coupled to receive the comparison output.

The pulse generation circuit also includes an output circuit configured to receive the first switch output and to generate the pulse signal based thereupon and in response to the clock signal, with the pulse signal having the first logic level based upon the first switch output having the second logic level.

The output circuit includes a sixth PMOS transistor having a source terminal coupled to a source voltage, a drain terminal coupled to a pulse signal node, and a gate terminal coupled to receive the first switch output, and a twelfth NMOS transistor having a drain terminal coupled to the pulse signal node, a source terminal coupled to ground, and a gate terminal coupled to receive the first switch output.

The pulse generation circuit also includes a pulse stop circuit configured to cause a transition of the pulse signal based upon the data input signal and the output signal matching, in response to the pulse signal having the first logic level, by discharging the comparison output.

The pulse stop circuit includes a second switch circuit having inputs coupled to the clock signal and the first switch output and configured to discharge the comparison output based upon the first switch output having the second logic level, in response to the clock signal, a third switch circuit having inputs coupled to the data input signal and the output signal and configured to discharge the comparison output based upon the data input signal and the output signal having the second logic level, a fourth switch circuit having inputs coupled to the complement of the data input signal and the complement of the output signal and configured to discharge the comparison output based upon the complement of the data input signal and the complement of the output signal having the first logic level, and a pulse stop transistor configured to activate the third and fourth switch circuits based upon the pulse signal having the first logic level.

The second switch circuit includes a third NMOS transistor having a drain terminal coupled to the node, a source terminal, and a gate terminal coupled to the clock signal, and a fourth NMOS transistor having a drain terminal coupled to the source terminal of the third NMOS transistor, a source terminal coupled to ground, and a gate terminal coupled to the first switch output. The pulse stop transistor is a fifth NMOS transistor having a drain terminal coupled to the node, a source terminal, and a gate terminal coupled to receive the pulse signal. The third switch circuit includes a sixth NMOS transistor having a drain terminal coupled to the source terminal of the fifth NMOS transistor, a source terminal, and a gate terminal coupled to the data input signal, and a seventh NMOS transistor having a drain terminal coupled to the source terminal of the sixth NMOS transistor, a source terminal coupled to ground, and a gate terminal coupled to the output signal. The fourth switch circuit includes an eighth NMOS transistor having a drain terminal coupled to the source terminal of the fifth NMOS transistor, a source terminal, and a gate terminal coupled to the complement of the data input signal, and a ninth NMOS transistor having a drain terminal coupled to the source terminal of the eighth NMOS transistor, a source terminal coupled to ground, and a gate terminal coupled to the complement of the output signal.

An output driver is coupled to the output of the pulsed latch circuit.

DETAILED DESCRIPTION

One or more embodiments of the present disclosure will be described below. These described embodiments are only examples of the presently disclosed techniques. Additionally, in an effort to provide a concise description, all features of an actual implementation may not be described in the specification.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Figure 1:
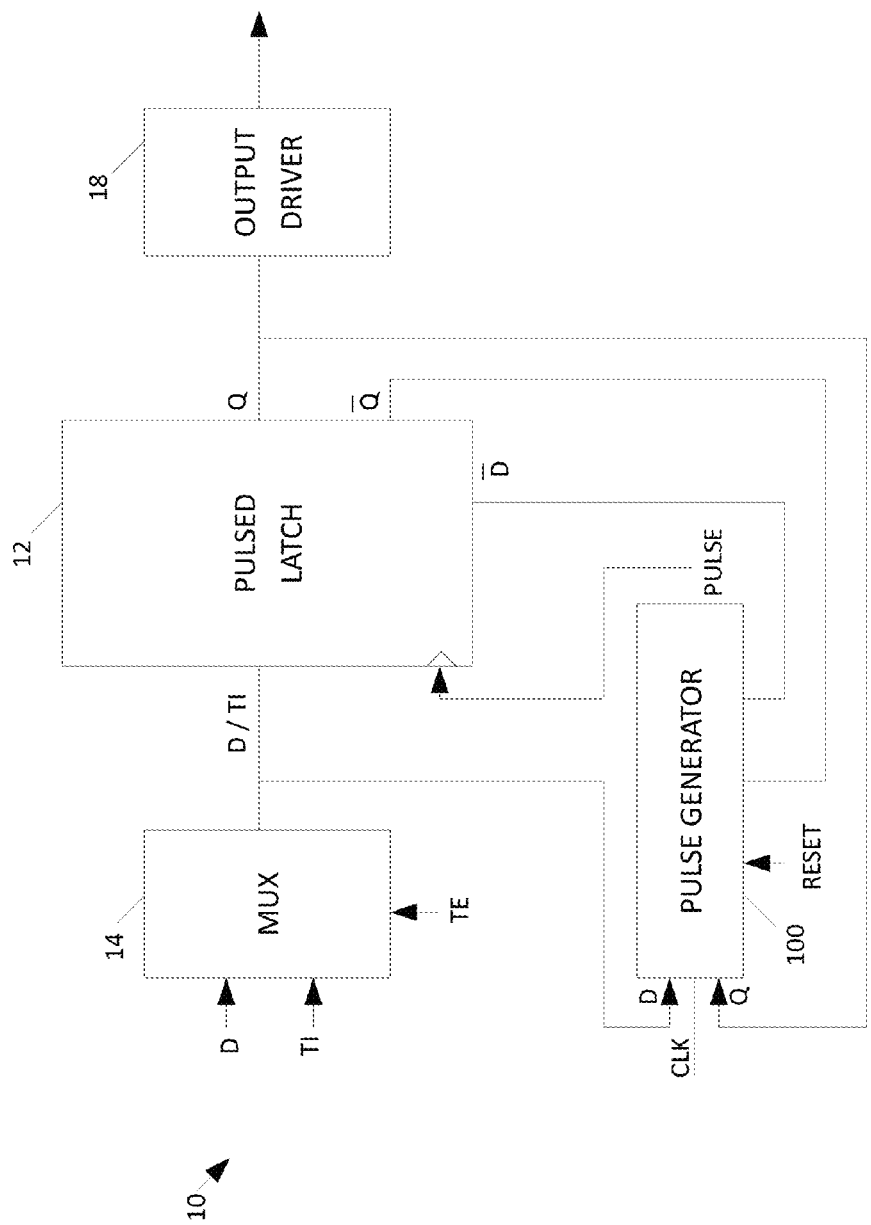
FIG. 1 is a block diagram of an electronic device in accordance with this disclosure.

With reference to FIG. 1, an electronic device 10 is now described. The electronic device 10 includes a D-Q type pulsed latch 12, which receives at its input a data input signal D output from a multiplexer 14. The pulsed latch 12 has an output Q coupled to an output driver 18. Operation of the pulsed latch 12 is triggered by a pulse signal PULSE output from a pulse generator 100. The pulsed latch 12 also generates a complement of the output Qbar and a complement of the data input signal Dbar. The data input signal D and its complement Dbar are coupled to the pulse generator 100, as well as the output Q and its complement Qbar.

The pulse generator 100, at each assertion of the clock CLK (such as a rising edge), compares the data input signal to an output signal or signals at the output of the pulsed latch 12. As will be appreciated by those of skill in the art, a D-Q type flop operates by latching an input signal to its output when it is clocked. Therefore, if there is a mismatch between the data input signal D received by the pulsed latch 12 and the output signal output Q by the pulsed latch 12, triggering thereof will serve to change the output signal Q to match the data input signal D. Thus, when the result of the comparison between the data input signal D and the output signal Q by the pulse generator 100 indicates a mismatch, the pulse generator 16 generates a pulse for the pulsed latch 12, which causes the pulsed latch 12 to latch the data input signal D to the output Q. Conversely, when the input and output states match, the pulse generator 100 does not generate a pulse.

Assertion of the reset input RESET of the pulse generator 100 serves to pull the pulse signal low. The multiplexer 14 serves to multiplex the data input signal D and a test input signal TI based upon a test enable signal TE. This enables testing of the electronic device 10 with a known test input.

Figure 4:
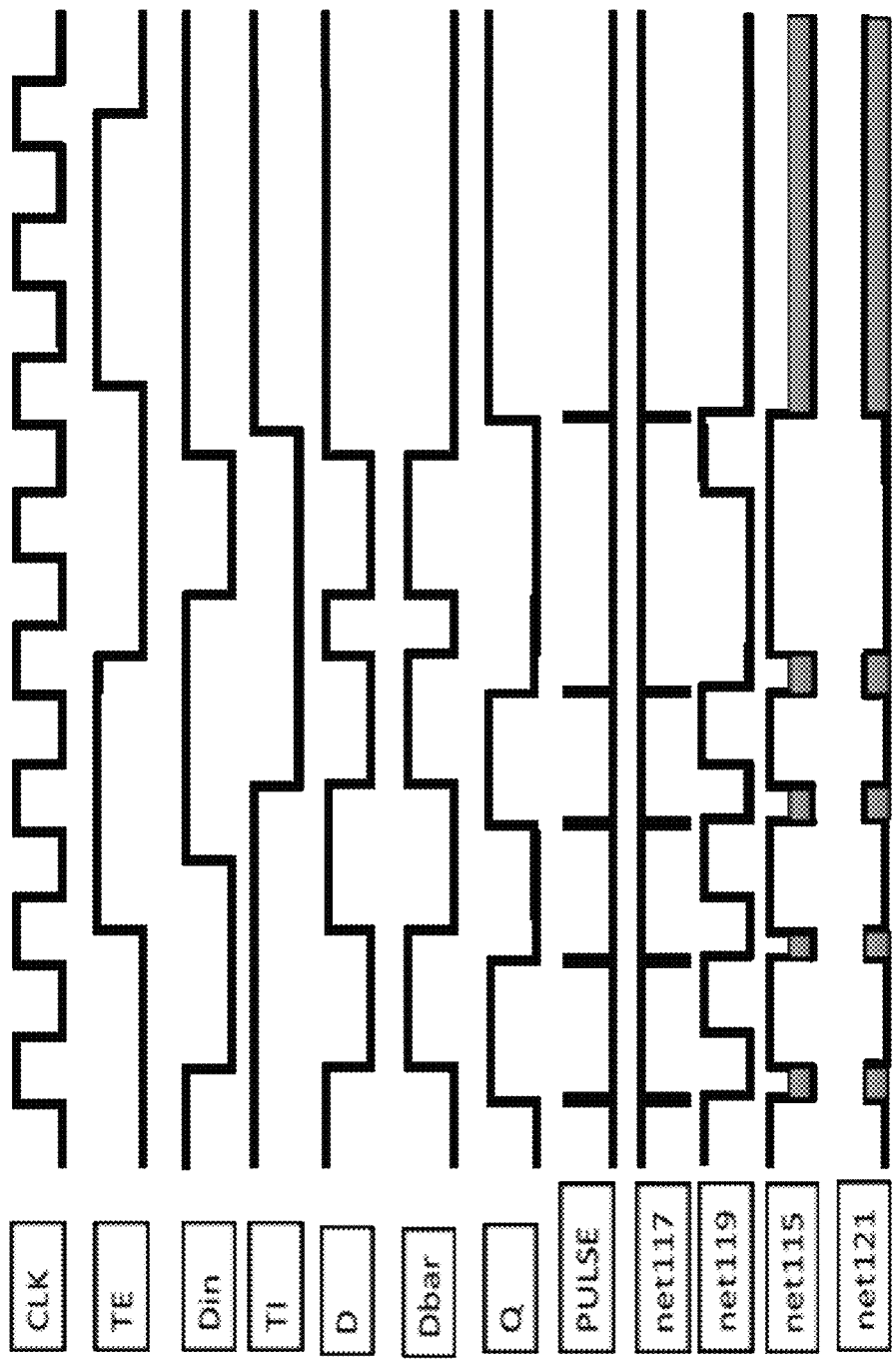
FIG. 4 is a timing diagram showing operation of the pulse generator of FIG. 2.

Further details of the pulse generator 100 will now be described with additional reference to FIGS. 2 and 4. The pulse generator 100 comprises a comparison circuit 110 that receives the data input signal D and the output signal Q and generates a comparison signal based thereupon. The comparison circuit 110 comprises a first logic circuit 112 with inputs coupled to the output signal Q and a complement of the data input signal Dbar. The comparison circuit 110 also includes a second logic circuit 114 having inputs coupled to a complement of the output signal Qbar and the data input signal D. The outputs of the first and second logic circuits 112, 114 are coupled at a comparison node 115.

The comparison signal has a first logic level (for example, high) when the data input signal and the output signal are mismatched, and has a second logic level (for example, low) when the data input signal and the output signal match. A comparison transistor P5 is configured to generate a comparison output based upon the comparison signal when activated by the clock signal. The comparison output has the first logic level when the comparison signal has the first logic level, and has the second logic level when the comparison signal has the second logic level.

The pulse generation circuit 100 also includes a first switch circuit 120 configured to receive the comparison output and the clock signal CLK and to generate a first switch output based thereupon. The first switch output has the second logic level based upon the comparison output having the first logic level, and the clock signal CLK being asserted.

An output circuit 130 is configured to receive the first switch output and to generate the pulse signal based thereupon when the clock signal CLK is asserted. The pulse signal has the first logic level based upon the first switch output having the second logic level.

A pulse stop circuit 140 is configured to cause a transition of the pulse signal based upon the data input signal D and the output signal Q matching, in response to the pulse signal having the first logic level, by discharging the comparison output at the node 119. Thus, when the data input signal D and the output Q match, the output circuit 130 generates the pulse signal PULSE as having the first logic level, and the pulse stop circuit 140 pulls the pulse signal PULSE low.

Transistor level details of the various circuits discussed above will be described below, and thereafter operation of the various circuits at the transistor level will be given.

The first logic circuit 112 includes a first PMOS transistor P1 having a source terminal coupled to a supply voltage, a drain terminal, and a gate terminal coupled to the output signal Q. The first logic circuit 112 also includes a second PMOS transistor P2 having a source terminal coupled to the drain terminal of the first PMOS transistor P1, a drain terminal coupled to the comparison node 115, and a gate terminal coupled to the coupled to the complement of the data input signal Dbar.

The second logic circuit 114 comprises a third PMOS transistor P3 having a source terminal coupled to the supply voltage, a drain terminal, and a gate terminal coupled to the complement of the output signal Qbar. The second logic circuit 114 also includes a fourth PMOS transistor P4 having a source terminal coupled to the drain terminal of the third PMOS transistor P3, a drain terminal coupled to the comparison node 115, and a gate terminal coupled to the data input signal D.

The comparison transistor P5 comprises a fifth PMOS transistor P5 having a source terminal coupled to receive the comparison signal, a drain terminal coupled to the node 119, and a gate terminal coupled to the clock signal CLK.

The first switch circuit 120 comprises a first NMOS transistor N1 having a drain terminal coupled to a first switch output 117, a source terminal, and a gate terminal coupled to the clock signal CLK. A second NMOS transistor N2 has a drain terminal coupled to the source terminal of the first NMOS transistor N1, a source terminal coupled to ground, and a gate terminal coupled to receive the comparison output.

The output circuit 130 includes a sixth PMOS transistor P6 having a source terminal coupled to a source voltage, a drain terminal, and a gate terminal coupled to receive the first switch output. A twelfth NMOS transistor N12 has a drain terminal coupled to the drain of the sixth PMOS transistor P6, a source terminal coupled to ground, and a gate terminal coupled to receive the first switch output. The sixth PMOS transistor P6 and the twelfth NMOS transistor N12 form an inverter.

The pulse stop circuit 140 comprises a second switch circuit 146 having inputs coupled to the clock signal and the first switch output, and is configured to discharge the comparison output based upon the first switch output having the first logic level, and in response to the clock signal CLK being asserted. A third switch circuit 142 has inputs coupled to the data input signal D and the output signal Q, and is configured to discharge the comparison output based upon the data input signal D and the output signal Q having the second logic level.

A fourth switch circuit 144 has inputs coupled to the complement of the data input signal Dbar and the complement of the output signal Qbar, and is configured to discharge the comparison output based upon the complement of the data input signal Dbar and the complement of the output signal Qbar having the first logic level. A pulse stop transistor N5 is configured to activate the third and fourth switch circuits 142, 144 based upon the pulse signal PULSE having the first logic level.

The second switch circuit 142 comprises a third NMOS transistor N3 having a drain terminal coupled to the comparison node 115, a source terminal, and a gate terminal coupled to the clock signal CLK. A fourth NMOS transistor N4 has a drain terminal coupled to the source terminal of the third NMOS transistor N3, a source terminal coupled to ground, and a gate terminal coupled to the first switch output. In addition, the pulse stop transistor N5 comprises a fifth NMOS transistor N5 having a drain terminal coupled to the comparison node 115, a source terminal, and a gate terminal coupled to receive the pulse signal PULSE.

The third switch circuit 144 comprises a sixth NMOS transistor N6 having a drain terminal coupled to the source terminal of the fifth NMOS transistor N5, a source terminal, and a gate terminal coupled to the data input signal D. A seventh NMOS transistor N7 has a drain terminal coupled to the source terminal of the sixth NMOS transistor N6, a source terminal coupled to ground, and a gate terminal coupled to the output signal Q.

The fourth switch circuit 144 comprises an eighth NMOS transistor N8 having a drain terminal coupled to the source terminal of the fifth NMOS transistor N5, a source terminal, and a gate terminal coupled to the complement of the data input signal Dbar. A ninth NMOS transistor N9 has a drain terminal coupled to the source terminal of the eighth NMOS transistor N8, a source terminal coupled to ground, and a gate terminal coupled to the complement of the output signal Qbar.

Transistor level operation of the various circuits discussed above will now be described. In the case where the data input signal D and the output Q are the same, neither the first logic circuit 112 nor the second logic circuit 114 will turn on and therefore they will not source current into node 115, as shown in FIG. 5. For example, if both the data input signal D and the output Q are at a logic high, the first logic circuit 112 will not turn on because, while the second PMOS transistor P2 would turn on (since Dbar would be a logic low fed to the gate), the first PMOS transistor P1 would not turn on (since Q would be a logic high fed to the gate). The second logic circuit 114 would not turn on because, while the third PMOS transistor P3 would turn on (since Qbar would be a logic low fed to the gate), the fourth PMOS transistor P4 would not turn on (since D would be a logic high fed to the gate). Thus, while the clock signal CLK is below the threshold voltage of the fifth PMOS transistor P5 thereby turning on the fifth PMOS transistor P5, neither the first logic circuit 112 nor the second logic circuit 114 is available to act as a current source, and the node 119 is thus at a logic low, as shown in FIG. 5.

Since the node 119 remains at a logic low, the first switch circuit 120 will not turn on, as a logic low will be at the gate of the second NMOS transistor N2. Thus, when the clock is high, the first switch circuit 120 will not operate to sink current, and the output circuit 130 will not output a logic high. Therefore, when the data input signal D and output Q are the same, the pulse signal PULSE as output by the output circuit 130 will be at a logic low.

In the case where the data input signal D and the output Q are mismatched, either the first logic circuit 112 or the second logic circuit 114 will turn on and conduct to source current. For example, if the data input signal D is at a logic high and the output Q is at a logic low, logic lows will be at the gates of the first and second PMOS transistors P1, P2, which will turn on. While the clock signal CLK is below the threshold voltage of the fifth PMOS transistor P5, the first logic circuit 112 will thus pull the comparison node 115 high.

The comparison node 115 being at a logic high will turn on the second NMOS transistor N2, and the first NMOS transistor N1 will be on while the clock signal is above the threshold voltage of the first NMOS transistor N1. During the time period at which both the fifth PMOS transistor P5 and the first NMOS transistor N1 are both on, the pulse signal node 117 will be pulled low, as shown in FIG. 4. The inverter formed by the sixth PMOS transistor P6 and twelfth NMOS transistor N12 will invert the signal at the pulse signal node 117 and output it as the pulse signal PULSE at a logic high.

The pulsed latch 12 of FIG. 1 will then be triggered by the pulse signal PULSE and latch the data input signal D to the output Q, such that the data input signal D and the output Q now match.

Operation of the pulse stop circuit 140 will now be described. When the clock signal CLK is below the threshold voltage of the eighth PMOS transistor P8, it will source current and pull the pulse signal node 117 high (as shown in FIG. 4), which the inverter formed by the sixth PMOS transistor P6 and twelfth NMOS transistor N12 of the output circuit 130 will invert, resulting in the pulse signal PULSE being pulled low. When the signal at the pulse signal node 117 is at a logic low, and the clock signal CLK is greater than the threshold voltage of the third NMOS transistor N3, the third and fourth NMOS transistors N3, N4 of the second switch circuit 146 switch on, and sink current from the node 119 into the node 121, pulling the node 119 low, as shown in FIG. 4. In addition, when the pulse signal PULSE is at a logic high, the fifth NMOS transistor N5 turns on, as do the sixth and seventh NMOS transistors N6, N7 when the data input signal D and output Q are at a logic high, or the eighth and ninth NMOS transistors N8, N9 when the data input signal D and output Q are at a logic low. This further serves to pull down the node 119.

Figure 2:
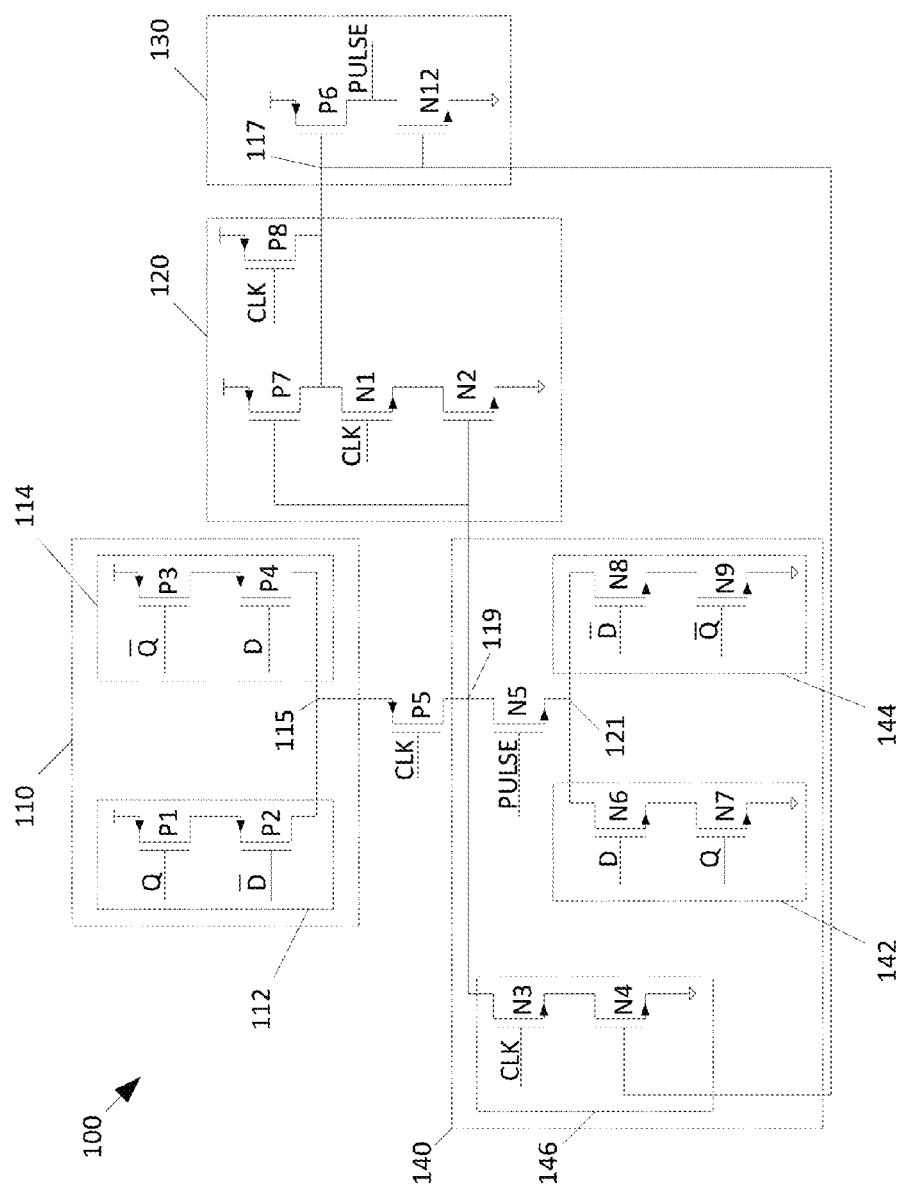
FIG. 2 is a schematic diagram of the pulse generator of FIG. 1.
Figure 3:
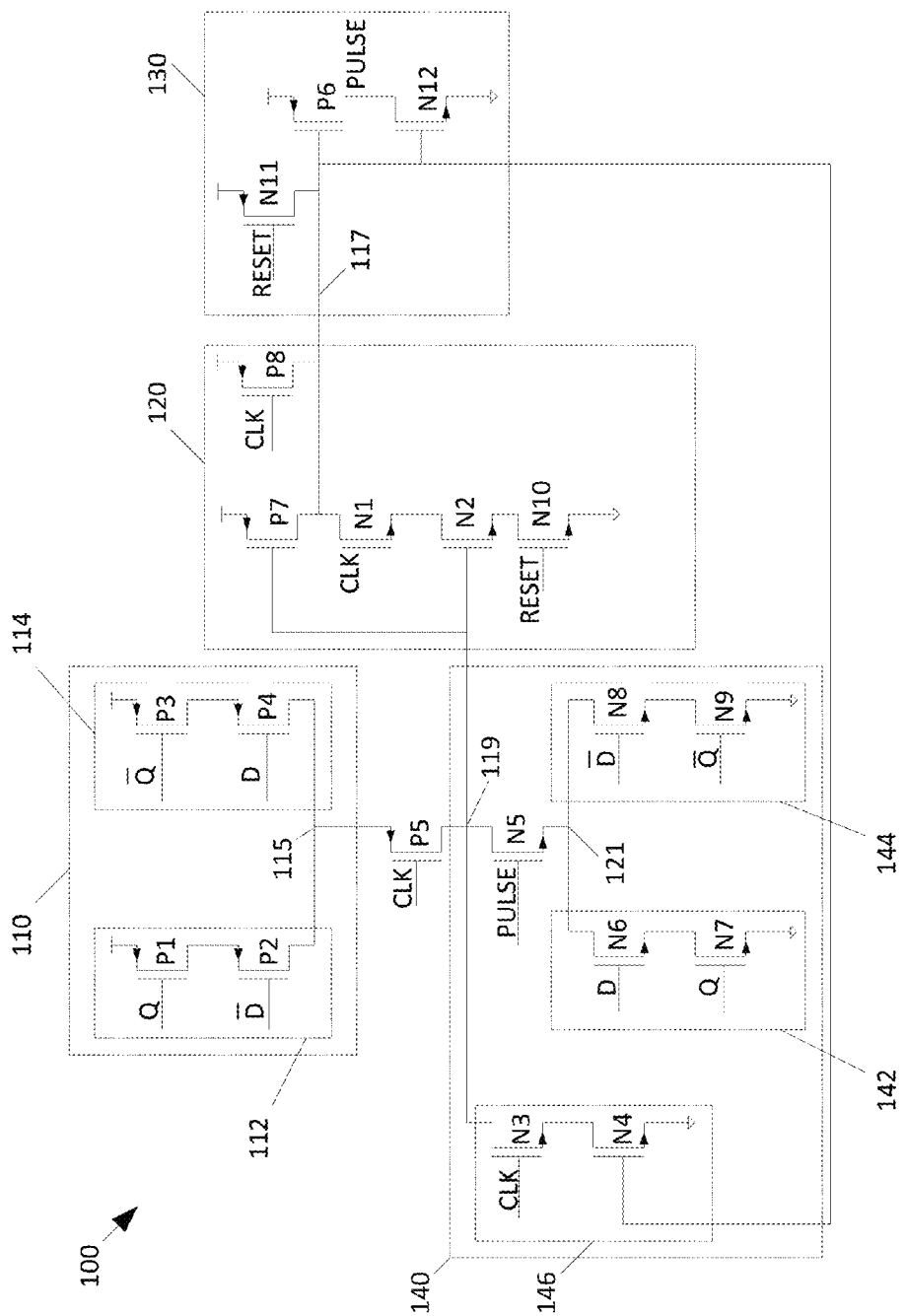
FIG. 3 is a schematic diagram of an embodiment of the pulse generator of FIG. 1 in which the pulse generator has a reset input.

Although the pulse generator 100 of FIG. 2 is not shown as having reset capability, as shown in FIG. 3, that functionality may be implemented by addition a tenth NMOS transistor N10 having its drain coupled to the source of the second NMOS transistor, its source coupled to ground, and its gate coupled to a reset signal RESET. In addition, an eleventh NMOS transistor N11 may have its source coupled to the power supply voltage, its drain coupled to the pulse signal node 117, and its gate coupled to the reset signal RESET. When the reset signal RESET is at a logic low, the tenth NMOS transistor N10 is switched off, and the eleventh NMOS transistor N11 is switched on, pulling the pulse signal node 117 high (as shown in FIG. 4), and thus resulting in the pulse signal PULSE being output by the inverter 130 as low.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An electronic device, comprising:
    a pulsed latch circuit configured to latch a data input signal to an output based upon receipt of a pulse signal; and
    a pulse generation circuit configured to compare the data input signal and an output signal at the output of the pulsed latch circuit, and to generate the pulse signal based upon a mismatch therebetween in response to a clock signal.

2. The electronic device of claim 1, wherein the pulse generation circuit comprises:
    a comparison circuit configured to receive the data input signal and the output signal and to generate a comparison signal based thereupon, the comparison signal having a first logic level when the data input signal and the output signal are mismatched and having a second logic level when the data input signal and the output signal match; and
    a comparison output circuit configured to generate a comparison output based upon the comparison signal in response to the clock signal, the comparison output having the first logic level when the comparison signal has the first logic level and having the second logic level when the comparison signal has the second logic level.

3. The electronic device of claim 2, wherein the comparison circuit comprises:
    a first logic circuit having inputs coupled to the output signal and a complement of the data input signal;
    a second logic circuit having inputs coupled to a complement of the output signal and the data input signal; and
    a comparison node coupled to outputs of the first and second logic circuits.

4. The electronic device of claim 3, wherein the first logic circuit comprises:
    a first PMOS transistor having a source terminal coupled to a supply voltage, a drain terminal, and a gate terminal coupled to the output signal;
    a second PMOS transistor having a source terminal coupled to the drain terminal of the first PMOS transistor, a drain terminal coupled to the comparison node, and a gate terminal coupled to the complement of the data input signal.

5. The electronic device of claim 3, wherein the second logic circuit comprises:
    a third PMOS transistor having a source terminal coupled to the supply voltage, a drain terminal, and a gate terminal coupled to the complement of the output signal,
    a fourth PMOS transistor having a source terminal coupled to the drain terminal of the third PMOS transistor, a drain terminal coupled to the comparison node, and a gate terminal coupled to the data input signal.

6. The electronic device of claim 2, wherein the comparison output circuit comprises a fifth PMOS transistor having a source terminal coupled to receive the comparison signal, a drain terminal coupled to a node, and a gate terminal coupled to the clock signal.

7. The electronic device of claim 2, wherein the pulse generation circuit further comprises:
    a first switch circuit configured to receive the comparison output and the clock signal and to generate a first switch output based thereupon, the first switch output having the second logic level based upon the comparison output having the first logic level.

8. The electronic device of claim 7, wherein the first switch circuit comprises:
    a first NMOS transistor having a drain terminal coupled to a first switch output, a source terminal, and a gate terminal coupled to the clock signal; and
    a second NMOS transistor having a drain terminal coupled to the source terminal of the first NMOS transistor, a source terminal coupled to ground, and a gate terminal coupled to receive the comparison output.

9. The electronic device of claim 2, wherein the pulse generation circuit further comprises:
    an output circuit configured to receive the first switch output and to generate the pulse signal based thereupon and in response to the clock signal, the pulse signal having the first logic level based upon the first switch output having the second logic level.

10. The electronic device of claim 9, wherein the output circuit comprises:
    a sixth PMOS transistor having a source terminal coupled to a source voltage, a drain terminal coupled to a pulse signal node, and a gate terminal coupled to receive the first switch output; and
    a twelfth NMOS transistor having a drain terminal coupled to the pulse signal node, a source terminal coupled to ground, and a gate terminal coupled to receive the first switch output.

11. The electronic device of claim 9, wherein the pulse generation circuit further comprises a pulse stop circuit configured to cause a transition of the pulse signal based upon the data input signal and the output signal matching, in response to the pulse signal having the first logic level, by discharging the comparison output.

12. The electronic device of claim 11, wherein the pulse stop circuit comprises:
    a second switch circuit having inputs coupled to the clock signal and the first switch output and configured to discharge the comparison output based upon the first switch output having the second logic level, in response to the clock signal;
a third switch circuit having inputs coupled to the data input signal and the output signal and configured to discharge the comparison output based upon the data input signal and the output signal having the second logic level;
a fourth switch circuit having inputs coupled to the complement of the data input signal and the complement of the output signal and configured to discharge the comparison output based upon the complement of the data input signal and the complement of the output signal having the first logic level; and
a pulse stop transistor configured to activate the third and fourth switch circuits based upon the pulse signal having the first logic level.

13. The electronic device of claim 12, wherein:
the second switch circuit comprises:
a third NMOS transistor having a drain terminal coupled to the node, a source terminal, and a gate terminal coupled to the clock signal,
a fourth NMOS transistor having a drain terminal coupled to the source terminal of the third NMOS transistor, a source terminal coupled to ground, and a gate terminal coupled to the first switch output;
the pulse stop transistor comprises a fifth NMOS transistor having a drain terminal coupled to the node, a source terminal, and a gate terminal coupled to receive the pulse signal;
the third switch circuit comprises:
a sixth NMOS transistor having a drain terminal coupled to the source terminal of the fifth NMOS transistor, a source terminal, and a gate terminal coupled to the data input signal,
a seventh NMOS transistor having a drain terminal coupled to the source terminal of the sixth NMOS transistor, a source terminal coupled to ground, and a gate terminal coupled to the output signal;
the fourth switch circuit comprises:
an eighth NMOS transistor having a drain terminal coupled to the source terminal of the fifth NMOS transistor, a source terminal, and a gate terminal coupled to the complement of the data input signal,
a ninth NMOS transistor having a drain terminal coupled to the source terminal of the eighth NMOS transistor, a source terminal coupled to ground, and a gate terminal coupled to the complement of the output signal.

14. The electronic device of claim 1, further comprising an output driver coupled to the output of the pulsed latch circuit.

15. An electronic device, comprising:
a comparison circuit configured to receive a data input signal and a latch output signal and to generate a comparison signal based thereupon, the comparison signal having a first signal level when the data input signal and the latch output signal are mismatched and having a second signal level when the data input signal and the latch output signal match;
a comparison transistor configured to generate a comparison output based upon the comparison signal in response to a clock signal, the comparison output having the first signal level when the comparison signal has the first signal level and having the second signal level when the comparison signal has the second signal level;
a first switch circuit configured to receive the comparison output and the clock signal and to generate a first switch output based thereupon, the first switch output having the second signal level based upon the comparison output having the first signal level.

16. The electronic device of claim 15, further comprising an output circuit configured to receive the first switch output and to generate a pulse signal based thereupon and in response to the clock signal, the pulse signal having the first signal level based upon the first switch output having the second signal level.

17. The electronic device of claim 15, wherein the comparison circuit comprises:
a first circuit having inputs coupled to the output signal and a complement of the data input signal;
a second circuit having inputs coupled to a complement of the output signal and the data input signal; and
a comparison node coupled to outputs of the first and second circuits.

18. The electronic device of claim 17, wherein the first circuit comprises:
a first PMOS transistor having a source terminal coupled to a supply voltage, a drain terminal, and a gate terminal coupled to the output signal;
a second PMOS transistor having a source terminal coupled to the drain terminal of the first PMOS transistor, a drain terminal coupled to the comparison node, and a gate terminal coupled to the coupled to the complement of the data input signal.

19. The electronic device of claim 17, wherein the second circuit comprises:
a third PMOS transistor having a source terminal coupled to the supply voltage, a drain terminal, and a gate terminal coupled to the complement of the output signal,
a fourth PMOS transistor having a source terminal coupled to the drain terminal of the third PMOS transistor, a drain terminal coupled to the comparison node, and a gate terminal coupled to the data input signal.

20. The electronic device of claim 15, wherein the comparison transistor comprises a fifth PMOS transistor having a source terminal coupled to receive the comparison signal, a drain terminal coupled to a node, and a gate terminal coupled to the clock signal.

21. A method of operating an electronic device, comprising:
latching a data input signal to an output based upon receipt of a pulse signal, using a pulsed latch circuit;
comparing the data input signal and an output signal at the output of the pulsed latch circuit in response to a clock signal, using a pulse generation circuit; and
generating the pulse signal based upon a mismatch therebetween, using the pulse generation circuit.

22. The method of claim 21, wherein generating the pulse signal comprises pulling the pulse signal to a first signal level based upon mismatch between the data input signal and the output signal, and pulling the pulse signal to a second signal level based upon the pulse signal having the first signal level.

* * * * *